US011482397B1

(12) United States Patent
Chaney et al.

(10) Patent No.: US 11,482,397 B1
(45) Date of Patent: Oct. 25, 2022

(54) HIGH OUTPUT ION SOURCE, ION IMPLANTER, AND METHOD OF OPERATION

(71) Applicant: Applied Materials, Inc., Santa Clara, CA (US)

(72) Inventors: Craig Richard Chaney, Lanesville, MA (US); Frank Sinclair, Boston, MA (US); Daniel R. Tieger, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 17/338,050

(22) Filed: Jun. 3, 2021

(51) Int. Cl.
*H01J 37/00* (2006.01)
*H01J 37/08* (2006.01)
*H01J 9/02* (2006.01)
*H01J 37/317* (2006.01)

(52) U.S. Cl.
CPC ............... *H01J 37/08* (2013.01); *H01J 9/02* (2013.01); *H01J 37/3171* (2013.01); *H01J 2237/08* (2013.01)

(58) Field of Classification Search
CPC ............ H01L 31/1872; H01L 31/182; H01L 31/03926; H01L 31/0236; H01L 31/046; H01L 31/068; H01M 10/0583
See application file for complete search history.

(56) References Cited

U.S. PATENT DOCUMENTS

2001/0020813 A1 * 9/2001 Lee .................. H01J 9/025
313/496

FOREIGN PATENT DOCUMENTS

WO WO-2014018855 A1 * 1/2014 ............ H01M 10/04

OTHER PUBLICATIONS

Sadhan Chandra Das et al. "Development of fast heating electron beam annealing setup for ultra high vacuum chamber," Review of Scientific Instruments 85, 025107 (2014); https://doi.Org/10.1063/1.4865458, Submitted: Oct. 26, 2013 . Accepted: Jan. 30, 2014 . Published Online: Feb. 19, 2014, 5 pages.
Jerome Tjerk Sebastian Beune, Influence of Hydrogen and Helium Plasma on the Recrystallization Kinetics of Tungsten, Master's Thesis, Eindhoven, Jan. 24, 2020, Award Date: 2020, 77 pages.
Yue Wang et al., "Local work functions of clean tungsten surfaces under electric fields based on ab initio calculations," 2 pages.
Jorge Andrés Rosas Saad, "Tungsten Recrystallization Behavior Under Steady and Transient Hydrogen Plasma Loading," Thesis, Department of Materials Science and Engineering, Faculty of Mechanical, Maritime and Materials Engineering, Delft University of Technology Delft, The Netherlands, Date Aug. 30, 2018, 118 pages.

(Continued)

*Primary Examiner* — David E Smith
*Assistant Examiner* — Hsien C Tsai
(74) *Attorney, Agent, or Firm* — KDB Firm PLLC

(57) ABSTRACT

An ion source is provided. The ion source may include an ion source chamber, and a cathode disposed in the ion source chamber and configured to emit electrons to generate a plasma within the ion source chamber, the cathode comprising a refractory metal, wherein the refractory metal comprises a macrocrystalline structure.

20 Claims, 6 Drawing Sheets

(56) References Cited

OTHER PUBLICATIONS

T.M. Gardiner et al., "The Surface Structure of The <110> Zone of Tungsten: a Leed and Work Function Study," Surface Science 112 (1981) 181-196, North-Holland Publishing Company, 16 pages.

T.T. Thabethe et al., "The effect of thermal annealing in a hydrogen atmosphere on tungsten deposited on 6HeSiC," ScienceDirect, journal homepage: www.elsevier.com/locate/vacuum, Vacuum 129 (2016) 161-165, 6 pages.

A.A. Brown et al., "Thermionic Work Function of the (100) Face of a Tungsten Single Crystal," Journal of Applied Physics, https://aip.scitation.org/doi/10.1063/1.1699413, vol. 21. Issue 1 > J0.1063/11699413, Published online: Apr. 29, 2004, 12 pages.

Zhe Zhao et al., "Effect of grain size on the behavior of hydrogen/helium retention in tungsten: a cluster dynamics modeling," 2017 Nucl. Fusion 57 086020 , This content was downloaded from IP address 152.135.148.124 on Feb. 15, 2020 at 23:20, https://doi.org/10.1088/1741-4326/aa7640, 11 pages.

\* cited by examiner

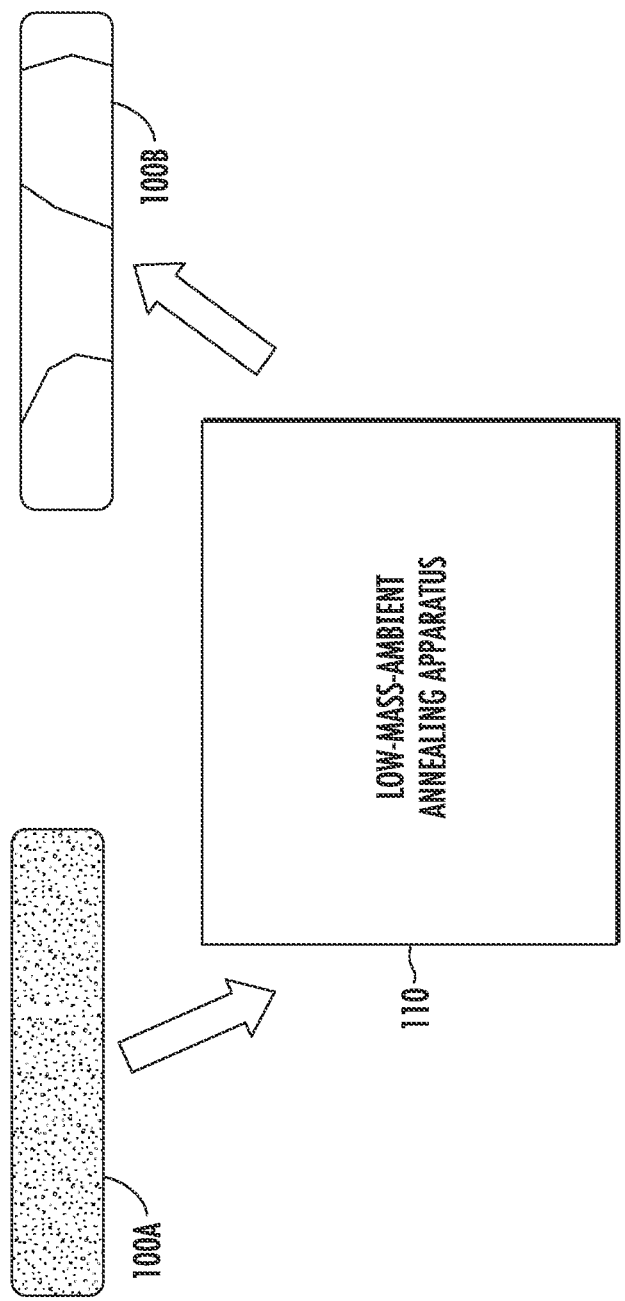

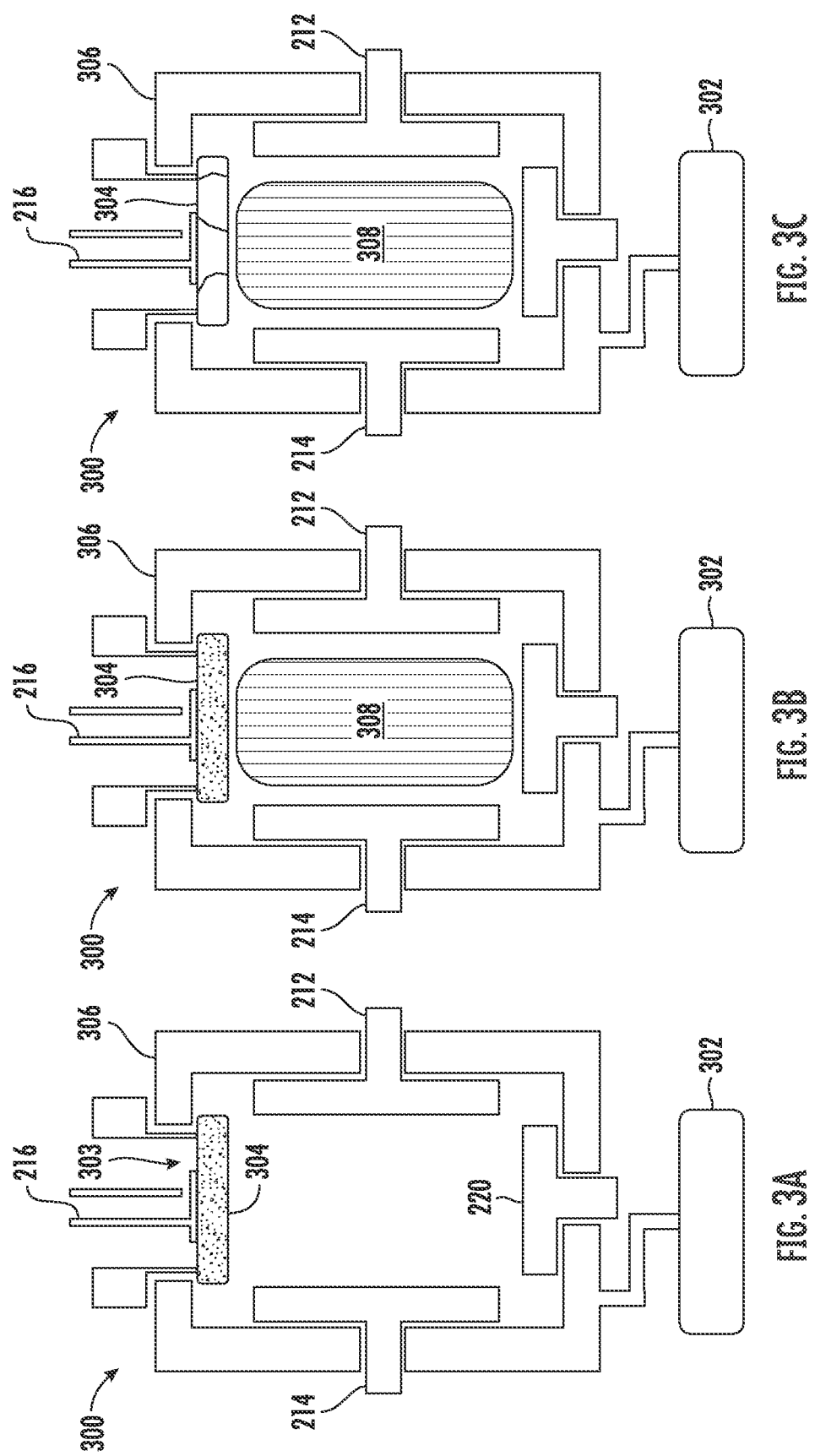

HIGH OUTPUT ION SOURCE, ION IMPLANTER, AND METHOD OF OPERATION

FIELD

Embodiments relate to the field of ion sources. More particularly, the present embodiments relate to an improved output and improved lifetime ion sources.

BACKGROUND

Ion sources are widely deployed in various processing apparatus and systems, including ion assisted deposition system, ion deposition systems, as well as beamline ion implanters, to name a few examples. Many types of ion sources employ refractory materials, such as a refractory metals, for various components of the ion source. These components include filaments, cathodes, emitters, repellers, adjunct electrodes, among other materials. In indirectly heated cathode sources (IHC sources), refractory components include a cathode, a filament, used to heat the cathode, a repeller, disposed opposite the cathode, as well as optional bias electrodes. These materials may be subject to erosion during use, including during generation of plasmas containing reactive gases. In addition, the efficiency of components such as filaments and cathodes may tend to change during the lifetime of such components. Thus, the stability of output and efficiency of ion sources may be less than ideal.

It is with respect to these and other considerations that the present disclosure is provided.

SUMMARY

Embodiments include improved ion sources and techniques for improving ion sources and ion source operation. In one embodiment an ion source is provided. The ion source may include an ion source chamber, and a cathode disposed in the ion source chamber and configured to emit electrons to generate a plasma within the ion source chamber, the cathode comprising a refractory metal, wherein the refractory metal comprises a macrocrystalline structure.

In another embodiment, an ion implanter may include an ion source, to generate an unanalyzed ion beam; and an analyzer to receive the unanalyzed beam and to generate an analyzed ion beam. The ion source further may include at least one component body, where the at least one component body includes at least one of a cathode, a filaments, a repellers, an ion source body, a liner, an adjunct electrode. As such, the at least one component body may be formed of a refractory metal, having a macrocrystalline structure.

In another embodiment, a method to fabricate a high output ion source component, is provided. The method may include providing a component body, the component body comprising a refractory metal having a microcrystalline structure. The method may include annealing the component body in low-mass ambient at an annealing temperature of at least 1000° C., for a dwell time of at least several hours, wherein the refractory material has a macrocrystalline structure after the annealing.

BRIEF DESCRIPTION OF THE DRAWINGS

FIG. 1 depicts processing of a refractory metal ion source component, according to embodiments of the disclosure;

FIGS. 3A-3C depict processing of a refractory target in a vacuum or low-mass ambient anneal apparatus at different stages, according to embodiments of the present disclosure;

DETAILED DESCRIPTION

Figure 2B:
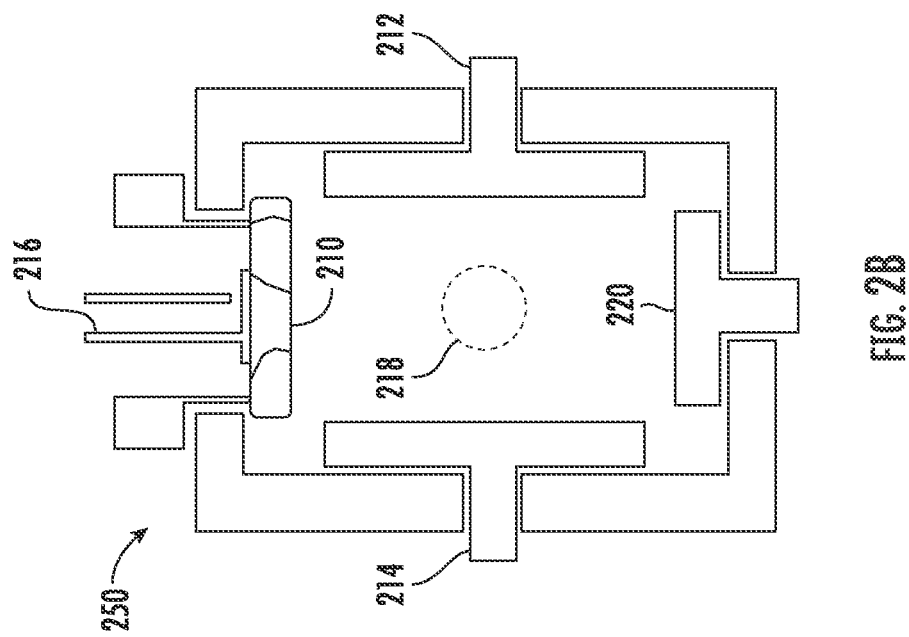
FIG. 2A and FIG. 2B depict exemplary ion sources, according to different embodiments of the disclosure.

The present disclosure will now be described more fully hereinafter with reference to the accompanying drawings, in which some embodiments are shown. The subject of this disclosure, however, may be embodied in many different forms and should not be construed as limited to the embodiments set forth herein. Rather, these embodiments are provided so that this disclosure will be thorough and complete, and will fully convey the scope of the subject of this disclosure to those skilled in the art. In the drawings, like numbers refer to like elements throughout.

In various exemplary embodiments, processes, materials and components are provided to improve performance and/or extend operating life of an ion source. Ion sources arranged according to the present embodiments include those ion sources that are constructed from refractory metal materials and designed to operate at elevated temperatures. Included among such ion sources are indirectly heated cathode (IHC) ion sources where a cathode may operate at temperatures in excess of 2000° C., such as about 2200° C. or greater. Other suitable ion sources according to the present embodiments include Freeman sources, and Bernas sources. The ion sources of the present embodiments may be constructed, at least in part, from tungsten, tantalum, tungsten-tantalum alloys, lanthanated tungsten, or other refractory metal. In the present embodiments, novel ion source components are provided having a macrocrystalline structure. These components may include cathodes, filaments, repellers, ion source bodies, liners, and adjunct electrodes, according to various non-limiting embodiments.

A listing of exemplary materials suitable for use as ion source components according to the present embodiments is provided in table I. As shown in table I, in addition to components of pure W or pure Ta, tantalum-tungsten alloy components may be relatively rich in tantalum, between 90 and 97.5%. Lanthanated tungsten components may have 1-2% lanthanum oxide in a tungsten matrix. Suitable WK components may include just trace amounts of potassium (K), on the order of 10 to 100 parts per million. Further suitable refractory materials include molybdenum (Mo) and various alloys or doped Mo compositions, as listed in Table I.

TABLE I

Ion source component materials

| Cathode Material/ Alloy | % | % | % | % |
| --- | --- | --- | --- | --- |
| W | 99 | 99.999 | | |
| Wla ($La_2O_3$) | 99 | 1 | | |
| Wla ($La_2O_3$) | 98.5 | 1.5 | | |
| Wla ($La_2O_3$) | 98 | 2 | | |
| TaW | 97.5 | 2.5 | | |
| TaW | 92.5 | 7.5 | | |
| TaW | 90 | 10 | | |

TABLE I-continued

Ion source component materials

| Cathode Material/Alloy | % | % | % | % |
|---|---|---|---|---|
| Ta | 99 | 99.999 | | |
| WK | 99 | 60-65 ppm | | |
| WK | 99 | 30-70 ppm | | |
| WK | 99 | 15-40 ppm | | |
| WK | 99 | 100 ppm | | |
| Mo | 99 | | | |
| Mo HCT (K,O,W) | 99.9 | 150 ppm | 200 ppm | 300 ppm |
| MoTZM (Ti,Zr,W) | 99 | .4-.55 wt % | .6 .12 wt % | 300 ppm |
| MoLa (La,O) | 99.55 | .15-.75 wt% | 600-1250 ppm | |
| MoLa (La$_2$O$_3$) | 98.75 | .9-1.2 wt% | | |

In various embodiments of the disclosure, refractory metal components are provided having a macrocrystalline structure. Examples of a macrocrystalline structure are metals having a crystallite size or grain size of at least 0.5 mm, and in some cases up to several millimeters. Note that the crystallite size used as a criterion to define microcrystalline or macrocrystalline structure, may be an average crystallite size. In some examples, the dimensions of the refractory metal component may be on the order of millimeters or several centimeters, such that the grain size of the refractory metal component may be similar to the width, height, or length of the refractory metal component. As such, the properties of a refractory metal ion source component, arranged according to the present embodiments may differ from the properties of a present day ion source component used for the same purpose. For example, the work function of a macrocrystalline tungsten cathode made according to the present embodiments, may differ from the work function of a known tungsten cathode. Also a macrocrystalline cathode may have a more stable emission characteristic and thus produce a more stable plasma.

FIG. 1 depicts processing of a refractory metal ion source component, according to embodiments of the disclosure. As shown to the left side of FIG. 1, a refractory metal component 100A is provided. Examples of a suitable refractory metal component include a cathode, a filament, a repeller, an emitter, a bias electrode, or other ion source component. According to some embodiments of the disclosure, suitable materials for the refractory metal component 100A include those aforementioned materials, as listed in Table. I. The refractory metal component 100A may be a part that is fabricated according to known techniques. As such, the refractory metal component 100A may represent a commercially available part suitable for use in an ion source. For example, tungsten cathodes or filaments may be formed by hot pressing, melting, or sintering a tungsten powder. Such cathodes or filaments or other refractory metal components may exhibit what is termed herein a "microcrystalline structure" where the crystallite size is less than approximately 50 µm, and may often range from several tens of nanometers to several micrometers, on average.

As further depicted in FIG. 1, in accordance with embodiments of the disclosure, the refractory metal component 100A may be processed in a low-mass-ambient annealing apparatus 110. As used herein, the term "low-mass ambient" may refer to a vacuum environment or an environment containing a low-mass gaseous species, such as hydrogen or helium, or hydrogen-containing gaseous species. According to some embodiments, the low-mass-ambient annealing apparatus 110 may provide an annealing ambient that is nominally a vacuum environment, or an ambient that contains hydrogen, helium, a mixture of hydrogen and helium, or other hydrogen-containing ambient. In some embodiments, the low-mass-ambient annealing apparatus 110 may be a high temperature furnace capable of generating ambient temperatures above 1000 C, such as between 1000° C. and 2400° C., or 1000° C. to 3500° C. in different embodiments. In some embodiments, a low-mass ambient such as hydrogen gas, helium gas, or a combination of hydrogen and helium gas may be provided to a furnace that is heated between 1000° C. to 3500° C. In some embodiments, the low-mass-ambient annealing apparatus 110 may be capable of generating a plasma that contains low-mass species such as hydrogen or helium ions, while at the same time the refractory metal component 100A is heated to temperatures above 1000° C., such as between 1000° C. and 3500° C. In various embodiments, the low-mass-ambient annealing apparatus 110 may include any known heating component suitable for heating the refractory metal component 100A to an elevated temperature, such as between 1000° C. and 3500° C.

According to various embodiments of the disclosure, the refractory metal component 100A may be processed by the low-mass-ambient annealing apparatus 110 for a duration of at least several hours, after which duration, the refractory metal component 100A is transformed into the macrocrystalline structure of refractory metal component 100B. As such, the refractory metal component 100B may be suitable for use as a component in an ion source. Advantages provided by the refractory metal component 100B includes lower work function, and higher current output for given ion source operating conditions. For example, the refractory metal component 100B may represent a cathode that has a disc-shaped body, where according to non-limiting embodiments, the disc-shaped body has a thickness in a range of 0.1 to 0.5 inches, a diameter of 0.25 to 1.0 inch, or a width of 0.1 inch to 1.0 inch. Thus, a disc-shaped cathode processed according to FIG. 1 may initially have a microstructure initially where the crystallite size ranges from several tens of nanometers to several micrometers, where the disc-shaped cathode is then transformed into a macrocrystalline structure, as defined above.

Figure 2A:
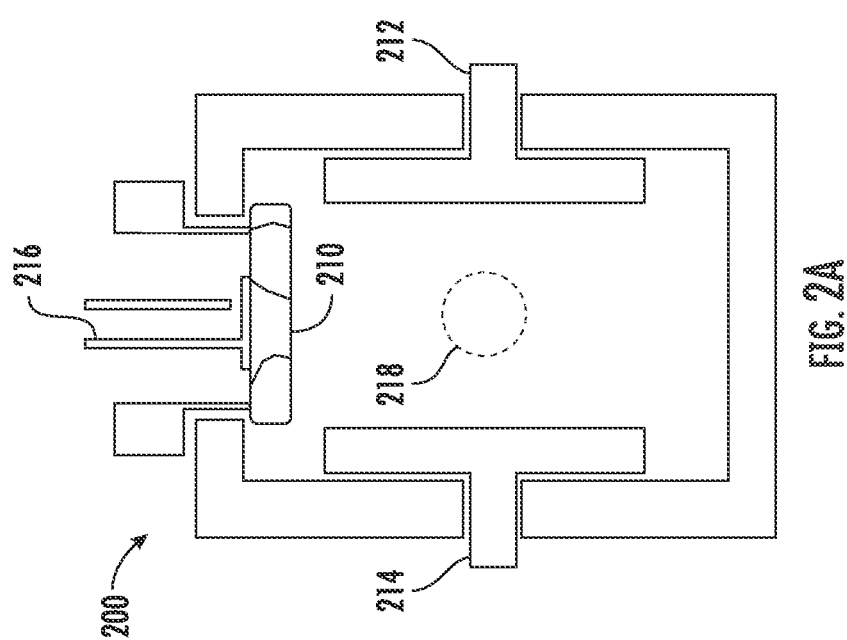

FIG. 2A and FIG. 2B depict exemplary ion sources, according to different embodiments of the disclosure. The ion source 200 of FIG. 2A may represent an indirectly heated cathode (IHC) ion source, including a cathode 210, bias electrode 212, bias electrode 214, and filament 216, and extraction aperture 218, as in known IHC ion sources. In this embodiment, the cathode 210 of ion source 200 is formed of a macrocrystalline refractory metal (see Table I for several non-limiting examples of suitable refractory metals), having a relatively lower work function, and accordingly higher output than a corresponding IHC ion source using a known refractory metal cathode.

The ion source 250 of FIG. 2B may represent a variant of the indirectly heated cathode (IHC) ion source of FIG. 2A, including a cathode 210, repeller 220, bias electrode 212, bias electrode 214, and filament 216, and extraction aperture 218, as in known IHC ion sources. In this embodiment, the cathode 210 of ion source 200 is also formed of a macrocrystalline refractory metal, having a relatively lower and more stable work function, and accordingly lower noise output than a corresponding IHC ion source using a known refractory metal cathode.

In further embodiments, the repeller of the ion source 200 or ion source 250 may be formed of a macrocrystalline refractory metal, and in further embodiments any or all of the bias electrode 212, bias electrode 214, and filament 216 may also be formed of a macrocrystalline refractory metal.

Figure 2C:
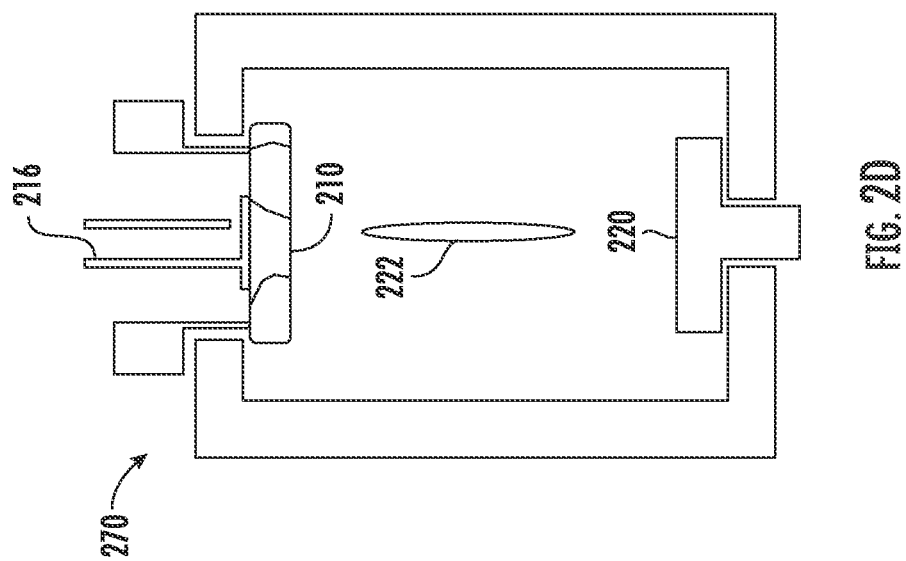
FIG. 2C and FIG. 2D depict exemplary ion sources, according to additional embodiments of the disclosure.
Figure 2D:
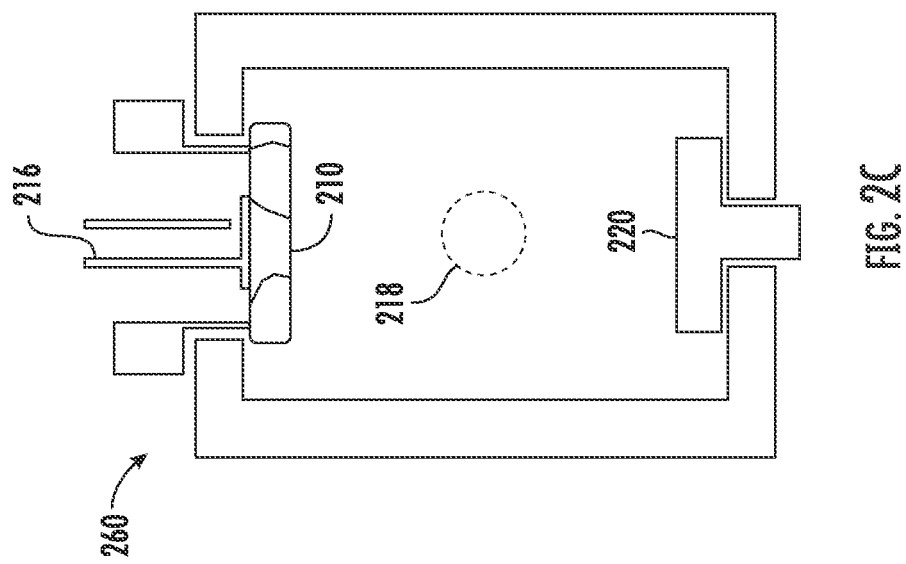

FIG. 2C and FIG. 2D depict exemplary ion sources, according to additional embodiments of the disclosure. The ion source 260 of FIG. 2C may represent a variant of the indirectly heated cathode (IHC) ion source of FIG. 2B, including a cathode 210, repeller 220, without bias electrodes. The ion source 270 of FIG. 2D may represent a variant of the indirectly heated cathode (IHC) ion source of FIG. 2C, including a cathode 210, repeller 220, where the extraction aperture 218 is replaced by extraction aperture 222, elongated along one axis, and suitable for generating a ribbon ion beam.

FIGS. 3A-3C depict processing of a refractory target in a vacuum or low-mass ambient anneal apparatus at different stages, according to embodiments of the present disclosure. The low-mass-ambient annealing apparatus 300 may include a chamber 306 and components to generate a plasma therein. As shown in FIG. 3A the low-mass-ambient annealing apparatus 300 may be configured with at least some components of an ion source, as described above with respect to FIG. 2A. As shown in FIG. 3A, the low-mass-ambient annealing apparatus 300 includes a cathode 303. In some embodiments the cathode 303 may be a metal component, arranged for accepting interchangeable conductive targets that may form part of the cathode 303 when installed. In FIG. 3A, a refractory metal target 304 is installed at the cathode. The cathode 303 may be a commercially available target for use as an ion source cathode, for example. As such, the refractory metal target may have a known microstructure, as described above, including polycrystalline grains having a grain size on the order of tens of nanometers to micrometers. The low-mass-ambient annealing apparatus 300 further includes a gas source 302, arranged to supply a low-mass gaseous ambient to the chamber 306, such as hydrogen, helium, or a hydrogen-containing gas.

At FIG. 3B, a low-mass gas is supplied to the chamber 306, and the low-mass ambient annealing apparatus 300 generates a plasma 308, between the cathode 303 and repeller 220. The plasma 308 may be enhanced with the use of bias electrode 212 and bias electrode 214. A magnet (not separately shown) may generate a magnetic field between the cathode 303 and the repeller 220, in order to confine electrons, while the repeller 220 may further repel electrons to confine the plasma 308. The refractory metal target 304 may be at least partially heated using a filament 216. The plasma 308 may include hydrogen-containing species or helium-containing species including ions, radicals, and other gaseous species, where the aforementioned species impinge upon the refractory metal target 304, while the refractory metal target 304 is heated to temperature in a range of 1200° C. to 2800° C. according to some embodiments. In embodiments that employ a magnet to generate a magnetic field, the magnetic field may serve to generate a confined hydrogen-containing plasma or a confined helium-containing plasma that heats the refractory metal target 304 to a temperature above 1000° C., in some examples with the aid of the filament 216.

In some examples, the plasma 308 is generated as an arc plasma when the refractory metal target 304 is heated and a potential difference (voltage) applied between chamber 306, on the one hand, and cathode 303 and repeller 220, where the cathode 303 and repeller 220 are held at the same potential. The vacuum or low-mass ambient annealing apparatus 300 may be coupled to various known components that are not depicted for clarity, including power supplies for the cathode 303 and filament 216. In various embodiments, gas may be provided in the form of helium, hydrogen, or other hydrogen-containing species, in order to generate the plasma 308. According to various embodiments, the pressure employed in the chamber 306 may range from the milliTorr (mTorr) range to 10 Torr, to several tens of Torr. At the stage depicted at FIG. 3B, the refractory metal target 304 has not been processed for sufficient duration to change the structure of the refractory metal target.

In FIG. 3C, the refractory metal target 304 has been processed by the plasma 308 for a duration sufficient to transform the structure to a macrocrystalline structure. At this point processing may be terminated and the refractory metal target 304 may be removed and installed for use in an ion source. Alternatively, in some embodiments, the low-mass ambient annealing apparatus 300 may be configured as an ion source, and may include an extraction aperture (not shown) to extract an ion beam. As such, the processing depicted in FIGS. 3A-3C may represent a pretreatment of a commercial cathode target, in order to generate an improved target material before use in an ion source.

EXAMPLES

The present inventors have observed that refractory metal targets used as cathodes in ion sources of beamline implanters may tend to age during use in a manner that affects the efficiency of operation of the ion source. During operation, the components of an ion source, such as an IHC ion source, may be exposed to a variety of ambients, including reactive ambients, such as reactive precursor gases for use to generate boron ions, phosphorous ions, arsenic ions, and other implant species. These gases often include fluorine, chlorine or oxygen that are known to react with refractory metals to produce volatile compounds. As such, a refractory metal target may tend to erode and wear out after hours, tens of hours, or hundreds of hours of use, for example. At the same time, the efficiency of operation of a cathode may tend to improve after many hours of use in some cases.

Figure 4B:
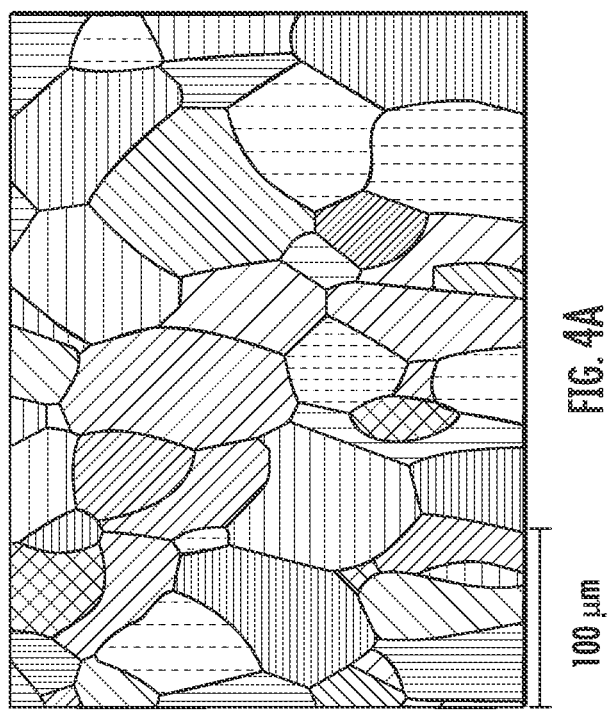
FIG. 4A and FIG. 4B depict the grain structure of a tungsten target at different stages of high temperature exposure to a hydrogen plasma ambient.
Figure 4A:
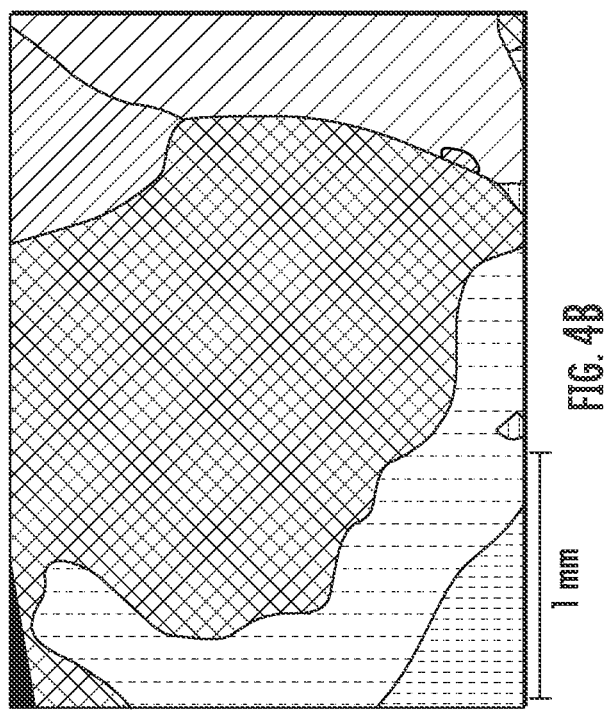

To investigate this phenomenon, the present inventors have conducted experiments where refractory tungsten targets are subjected to hydrogen-containing plasmas in an ion-source at high temperatures for extended period. In one example, a commercial tungsten cathode target type was studied before and after being subjected to such a high temperature plasma annealing procedure. The results of one set of experiments are illustrated in FIG. 4A and FIG. 4B, and are summarized in Table II.

As illustrated in Table II. a commercial tungsten targets were obtained, where X-ray diffraction analysis was conducted on an unused commercial tungsten target to determine the microstructure of the target. In this case, the target material was confirmed to be 100% crystalline α-tungsten BCC phase, having a crystallite size of approximately 33 nm. Thus, the commercial target has a very fine grain structure as received.

TABLE II

| Tungsten cathode structure | | | |
| --- | --- | --- | --- |
| Sample State | Phase | Crystallite Size | Crystallinity (%) |
| As received | αW — Tungsten Cubic | 32.7 nm ± 8.8 nm | 100.0 |
| Processed with PH3, AsH3, and BF3 plasmas | αW — Tungsten Cubic | 50 pm | 100.0 |

TABLE II-continued

Tungsten cathode structure

| Sample State | Phase | Crystallite Size | Crystallinity (%) |
|---|---|---|---|
| Processed with hydrogen plasma | αW — Tungsten Cubic | Macrocrystalline (~0.5 mm-3 mm) | 100.0 |

In one example, the commercial tungsten target was installed in an ion source cathode and was subjected to a hydrogen-containing plasma for extended period of time, with an estimated target temperature of 2200° C. to 2900° C., after which treatment, further analysis of the tungsten target was conducted. The target was processed for an estimated total of approximately 150 hours, where the process gas used to generate the hydrogen-containing plasma was a reactive gas, which gas was varied between $PH_3$, $AsH_3$, and $BF_3$ during operation of the ion source.

Another similar tungsten target was processed in a plasma based upon pure hydrogen, for approximately 20 hours, after which treatment, further analysis of the tungsten target was conducted.

The samples of the tungsten target were analyzed by X-ray diffraction after processing in the hydrogen-containing plasmas; however, the crystallite size was too large to be determined accurately by this technique. The reactive gas and hydrogen processed samples were then subjected to analysis using electron backscatter diffraction (EBSD) analysis, with results shown in FIG. 4A and FIG. 4B. In this technique, a secondary electron microscope (SEM) is used to create an array of diffraction patterns from different crystallites of a sample. A diffraction pattern is captured at every point in the SEM scan, often many hundreds of thousands of diffraction patterns. At crystallite boundaries, a change in crystallographic orientation takes place, even if the relative change in orientation is small. The EBSD technique exploits this difference to generate a map of crystallites based on the change in backscatter diffraction pattern as a function of position.

As illustrated in FIG. 4A, the reactive gas-processed tungsten target sample exhibits a crystallite size on the order of micrometers or tens of micrometers. The EBSD analysis yielded a minimum crystallite size of 4.4 micrometers, a maximum size of 124 micrometers, and average size of 51 micrometers.

As illustrated in FIG. 4B, the hydrogen processed tungsten target sample exhibited a crystallite size that was so large that a quantitative average could not be determined. However, as shown, the crystallite size could be estimated to be in the range of 0.5 mm to 3 mm, a size range that is termed "macrocrystalline" herein, as discussed previously.

Thus, the results summarized in Table II. show that high temperature annealing of the tungsten target in a hydrogen-containing plasma transform the tungsten target from a fine grained microstructure to a very large grain structure, and in the case of pure hydrogen plasma, into a macrocrystalline structure. Notably, the tungsten target processed in the reactive gases ($PH_3$, $AsH_3$, and $BF_3$) showed substantial target erosion, particularly in the target center, while the tungsten target processed in pure hydrogen plasma showed much less erosion.

The above results demonstrate that when the hydrogen-containing ambient does not include reactive gases that may tend to etch the tungsten target, the tungsten target may be transformed to a macrocrystalline structure without degradation of the target or loss of target material. The same will generally apply to other component bodies, such as repellers, filaments, bias electrodes, and the like, where the initial microstructure is microcrystalline. Additionally, the same should apply to tungsten alloy components, tantalum components, lanthanated tungsten components, as well as potassium-doped components, all having an initial microcrystalline structure. Thus, high temperature annealing of a tungsten target or similar refractory metal component in a hydrogen plasma or helium plasma may be more suitable than annealing in a hydrogen-containing plasma containing a reactive gas.

In further experiments, an ion source cathode made of tungsten was subjected to annealing in a helium plasma for a similar number of hours and at an estimated temperature similar to the annealing results for hydrogen-containing plasmas, discussed above, resulting in development of a similar macrocrystalline structure. Note that annealing in a helium plasma or hydrogen plasma may generate a small amount of tungsten erosion due to sputtering. This amount of erosion generated by annealing in a helium plasma or hydrogen may be maintained at an acceptable limit while still annealing the refractory metal component to yield a macrocrystalline structure.

In the aforementioned examples of annealing in plasmas, the ambient pressure may be estimated in the range of 1 Torr to 20 Torr or so. According to further embodiments of the disclosure, a refractory metal component may be subject to low mass ambient where the total pressure is substantially lower or higher. For example, refractory metal component may be annealed in a low-mass ambient where a low-mass gas such as helium or hydrogen is provided in a furnace at a pressure of less than 1 milliTorr, or alternatively may be annealed in a vacuum ambient where no gas is deliberately provided and the overall pressure is less than 1 milliTorr. The hydrogen or helium species in such ambient may be unionized gas species, for example.

While grain growth may proceed somewhat less rapidly at such low gas pressures, or by vacuum annealing as compared to the aforementioned examples of annealing in hydrogen or helium plasmas at pressures on the order of several Torr, suitable macroscopic grain structure may be attained by extending annealing time or increasing annealing temperature. Likewise, according to further embodiments, annealing may to generate a macrocrystalline structure in a refractory metal component may be performed in a hydrogen gas ambient or helium gas ambient at a higher pressure range, such as between 100 Torr and 2600 Torr.

Figure 5:
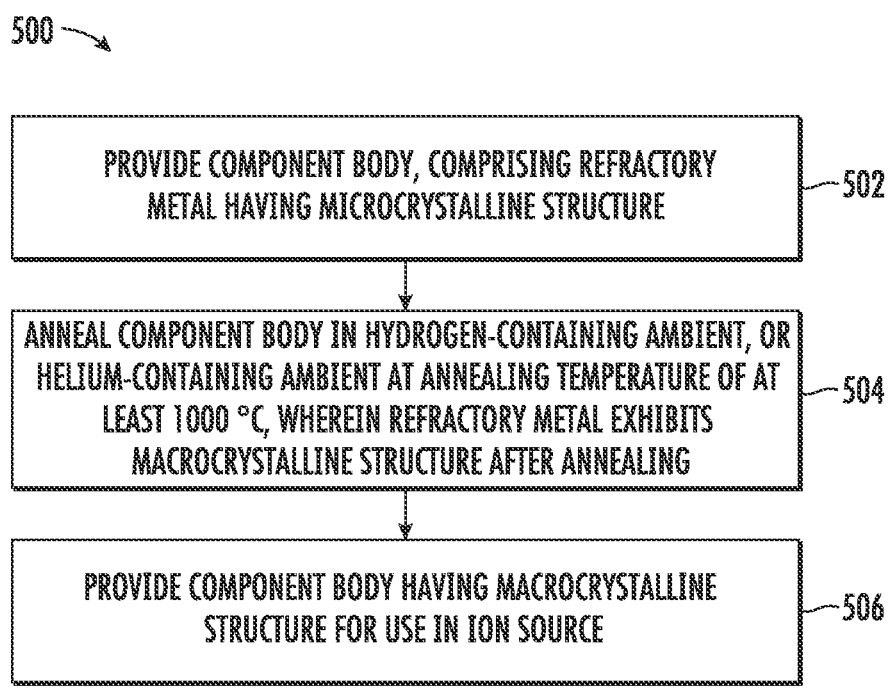
FIG. 5 depicts an exemplary process flow.

FIG. 5 depicts an exemplary process flow 500. At block 502 a component body is provided, formed of a refractory metal having a microcrystalline structure. Examples of a refractory metal include W, Ta, WTa alloys, lanthanated tungsten, potassium-doped tungsten, Mo, and other refractory metals. Suitable examples of a component body include an ion source cathode, repeller, bias electrodes, liner, ion source body, filaments, and other components.

At block 504, the component body is annealed in a hydrogen-containing ambient or helium-containing ambient at an annealing temperature of at least 1000° C. As such, the refractory metal may exhibit a macrocrystalline structure after annealing is completed. In some examples, the annealing temperature may be in the ranger of 2200° C. to 2900° C. In some examples, the component body may be annealed in a furnace having hydrogen gas ambient or helium gas ambient. In some embodiments, the annealing ambient may generate a pressure in the range of less than 1 milliTorr up to 2600 Torr. In some examples, the hydrogen-containing ambient may be a hydrogen plasma. Examples of suitable duration for annealing are at least 1 hour, or between 50 hours and 100 hours. Optionally, the annealing may take place in a magnetic field.

At block 506, the component body, having the macrocrystalline structure, is provided for use in an ion source.

In one variant, the component body may be a target, such as a cathode target, that is initially installed in an "annealing" ion source having a microcrystalline structure. The cathode target may then be annealed in-situ in the ion source by exposing the cathode target to a hydrogen plasma for sufficient duration to generate a macrocrystalline structure, while not eroding the cathode target. As such, in some examples, the cathode target, once attaining the macrocrystalline structure, may be used in the "annealing" ion source for generating ion beams, as in known ion sources.

Alternatively, the operation of block 504 may be performed in a dedicated annealing apparatus, such as a high temperature gas assisted heating apparatus, that heats the refractory metal component to a high temperature, while exposing the component to a hydrogen plasma, including an ion-source-type apparatus. The refractory metal component having the macrocrystalline structure may then be removed and installed ion an ion source for generating ion beams.

Advantages

An advantage of the present approach is the improved properties provided by a macrocrystalline refractory metal target in comparison to a known microcrystalline target. These improved properties include lower work function, higher emission and therefore higher current output, as well as more stable operation. Another advantage provided by the present approach is the ability is that in some embodiments, a commercial ion source component, such as a tungsten cathode target may be transformed in-situ in an ion source into a macrocrystalline structure without the need for special equipment. A further advantage provided by some embodiments is the ability to prepare multiple component bodies with a macrocrystalline structure in one annealing batch, such as cathodes, within a simple annealing furnace.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. An ion source, comprising:
   an ion source chamber; and
   a cathode disposed in the ion source chamber and configured to emit electrons to generate a plasma within the ion source chamber, the cathode comprising a refractory metal,
   wherein the refractory metal comprises a macrocrystalline structure.

2. The ion source of claim 1, wherein the cathode comprises tungsten, a tungsten-tantalum alloy, tantalum, lanthanated tungsten, potassium-doped tungsten, molybdenum (Mo) an Mo alloy, or a doped Mo composition.

3. The ion source of claim 2, wherein the cathode comprises a tantalum-tungsten alloy having a composition in a range between ninety percent tantalum and 98 percent tantalum.

4. The ion source of claim 1, wherein the macrocrystalline structure comprises a crystallite size of 0.5 mm or larger.

5. The ion source of claim 1, further comprising a repeller, disposed opposite the cathode, the repeller comprising a refractory metal having a macrocrystalline structure.

6. The ion source of claim 1, wherein the ion source comprises an indirectly heated cathode source.

7. The ion source of claim 1, wherein the ion source further comprises at least one bias electrode, the at least one bias electrode comprising a refractory metal having a macrocrystalline structure.

8. The ion source of claim 1, wherein the cathode comprises a disc-shaped body having a thickness in a range of 0.1 to 0.5 inches, a diameter of 0.25 to 1.0 inch, or a width of 0.1 inch to 1.0 inch.

9. An ion implanter, comprising:
   an ion source, to generate an unanalyzed ion beam; and
   an analyzer to receive the unanalyzed ion beam and to generate an analyzed ion beam,
   wherein the ion source further comprises at least one component body, the at least one component body comprising:
   a cathode, a filament, a repeller, an ion source body, a liner, or an adjunct electrode,
   and wherein the at least one component body comprises a refractory metal, having a macrocrystalline structure.

10. The ion implanter of claim 9, wherein the cathode comprises tungsten, a tungsten-tantalum alloy, tantalum, lanthanated tungsten, potassium-doped tungsten, molybdenum (Mo) an Mo alloy, or a doped Mo composition.

11. The ion implanter of claim 9, wherein the macrocrystalline structure comprises a crystallite size of 0.5 mm or larger.

12. The ion implanter of claim 9, comprising a repeller, disposed opposite a cathode, the cathode and the repeller comprising the refractory metal having the macrocrystalline structure.

13. A method to fabricate a high output ion source component, comprising:
   providing a component body, the component body comprising a refractory metal having a microcrystalline structure; and
   annealing the component body in a low-mass ambient at an annealing temperature, of at least 1000° C., for a dwell time of at least several hours, wherein the refractory metal has a macrocrystalline structure after the annealing.

14. The method of claim 13, wherein the annealing temperature is in a range of 1000° C. to 3000° C.

15. The method of claim 13, wherein the annealing takes place in a hydrogen-containing ambient comprising hydrogen gas, a pure hydrogen plasma, or a hydrogen-containing plasma.

16. The method of claim 13, wherein the annealing takes place in a helium-containing ambient comprising helium gas or a helium-containing plasma.

17. The method of claim 13, wherein the component body is a cathode of an ion source, wherein the ion source further comprises a repeller, disposed opposite the cathode, wherein the annealing takes place in a hydrogen-containing plasma or in a helium-containing plasma, wherein the annealing comprises:

generating a magnetic field between the cathode and the repeller, wherein the magnetic field generates a confined hydrogen-containing plasma or a confined helium-containing plasma that heats the cathode to a temperature above 1000° C.

18. The method of claim 13, wherein the annealing takes place in an annealing ambient, comprising hydrogen, helium, or a combination of the two, at a pressure between 0.1 mTorr and 2600 Torr.

19. The method of claim 13, wherein the annealing takes place in a vacuum ambient, at a pressure of less than 1 mTorr.

20. The method of claim 13, wherein the component body comprises tungsten, a tungsten-tantalum alloy, tantalum, molybdenum, lanthanated tungsten, potassium-doped tungsten, molybdenum (Mo) an Mo alloy, or a doped Mo composition, and wherein the macrocrystalline structure comprises a crystallite size of 0.5 mm or larger.

\* \* \* \* \*